United States Patent [19]

Eby

[11] Patent Number: 4,658,380
[45] Date of Patent: Apr. 14, 1987

[54] CMOS MEMORY MARGINING CONTROL CIRCUIT FOR A NONVOLATILE MEMORY

[75] Inventor: Michael D. Eby, Centerville, Ohio

[73] Assignee: NCR Corporation, Dayton, Ohio

[21] Appl. No.: 834,995

[22] Filed: Feb. 28, 1986

[51] Int. Cl.⁴ ...................... G11C 29/00; G11C 11/40
[52] U.S. Cl. .................................................. 365/201
[58] Field of Search ........................... 371/21; 365/201

[56] References Cited

U.S. PATENT DOCUMENTS

| | | | |
|---|---|---|---|
| 4,223,394 | 9/1980 | Pathak et al. | 365/189 |
| 4,418,403 | 11/1983 | O'Toole et al. | 365/201 |
| 4,459,686 | 7/1984 | Toyoda | 365/201 |
| 4,502,140 | 2/1985 | Proebsting | 365/201 |

Primary Examiner—James W. Moffitt
Attorney, Agent, or Firm—Wilbert Hawk, Jr.; Casimer K. Salys

[57] ABSTRACT

A circuit for enabling off-chip measurement of an on-chip generated reference voltage and for effectuating the memory margin testing of nonvolatile memory cells in wells of a CMOS integrated circuit chip. The circuit is configured to selectively couple off-chip voltages of positive and negative potential to nodes on the chip while avoiding undesired forward biasing of p-n junctions. Control is initiated by varying the functions the input pads perform.

9 Claims, 5 Drawing Figures

CMOS MEMORY MARGINING CONTROL CIRCUIT FOR A NONVOLATILE MEMORY

BRIEF SUMMARY

The present invention relates to an electronic control circuit and more particularly to an integrated form of such circuit configured with complementary MOS (CMOS) devices sharing a common substrate (chip) with an array of nonvolatile memory cells. In one form of its practice, the invention involves the use of electronic signals which are coupled to and from the substrate via three connecting points, commonly referred to as pads or substrate nodes. Based upon the voltages provided on such nodes, the circuit responds by operating in one of three distinct modes. According to the first, "normal," mode of operation the control circuit connects on-chip voltages to the nonvolatile memory transistor gate electrodes and memory wells for conventional nonvolatile memory array operation. According to the second, "reference read," mode of operation the control circuit accesses and provides as an output on one pad the on-chip generated reference voltage used to bias the memory array during a conventional memory all read cycle. In the third mode, the control circuit interacts with the memory array, by biasing wells and the like, during the memory margin testing, "memory margining," used to measure the thresholds of conducting and nonconducting nonvolatile memory transistors in the course of characterizing the memory cell endurance and data retention.

The various active devices which contribute to form the functional groups in the invention are configured from p-channel and n-channel field effect transistors (FETs), arranged, interconnected and biased to accept both positive and negative voltages at the pads/nodes, to reside on a common substrate chip, and to operate with neither static nor transient occurrences of undesired forward conduction through p-n junctions interfacing source/drain regions, wells, or the substrate resident nodes of the chip.

To provide the functional features described above, the present CMOS circuit while resident on a common substrate with nonvolatile memory cells is comprised of:

wells of first impurity type having formed therein field effect devices of second impurity type, the substrate itself being of second impurity type;

means for generating a reference potential on the substrate;

means for selectively connecting the reference potential to gate electrodes of selected memory cells in time correspondence with a connection of selected wells for the selected memory cells to a first substrate node providing a first potential;

means for enabling the measurement of the reference potential at a second substrate node responsive to a control signal connected through a third substrate node; and means responsive to a memory margining test mode enabling signal on a fourth substrate node for selectively enabling the measurement of memory cell threshold potentials of a first polarity type, corresponding to a first binary state stored in a cell, by connecting a first well bias potential through the third substrate node to selected wells, and by connecting a margin testing potential through the second substrate node to the gate electrodes of selected memory cells, and for selectively enabling the measurement of memory cell threshold potentials of the second polarity type, corresponding to a second binary state stored in a cell, by connecting a second well bias potential through the third substrate node to selected wells, and by connecting a margin test potential through the second substrate node to the gate electrodes of selected memory cells.

These and other beneficial features of the invention will be more clearly understood and appreciated upon considering the detailed description which follows.

DETAILED DESCRIPTION

Figure 1:
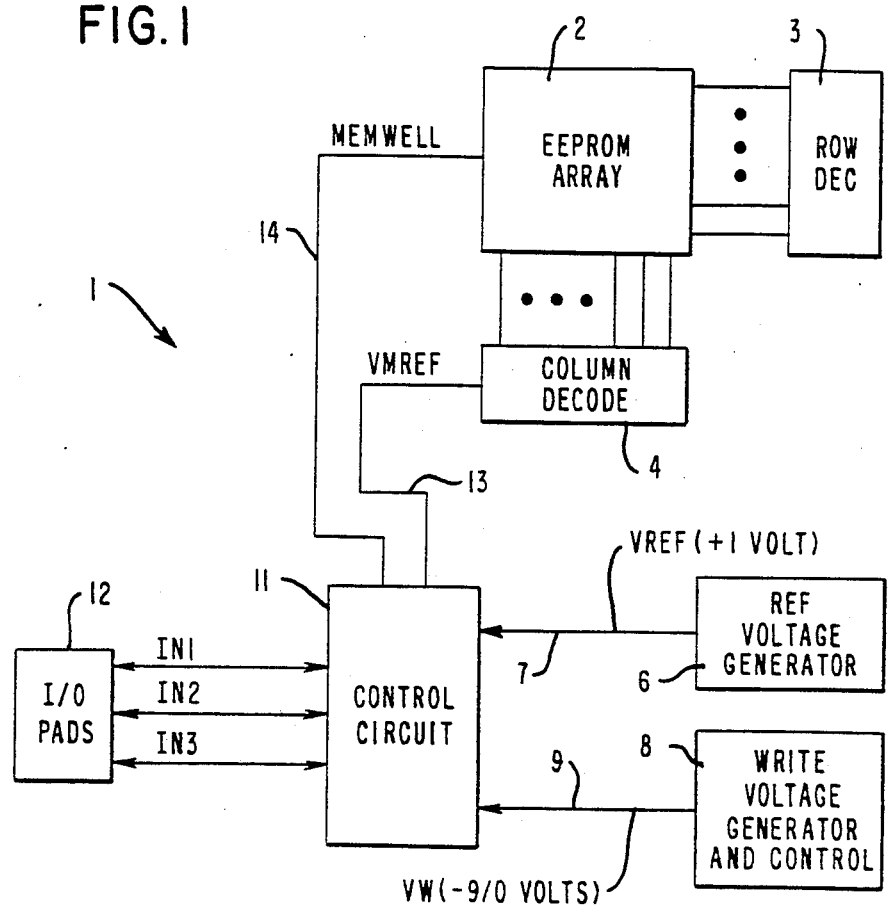
FIG. 1 is a functional block diagram of the control circuit and other elements of a nonvolatile memory chip.

A variety of cell structures exist for creating electrically erasable programmable read-only memory (EEPROM) arrays on semiconductor chips. With the advent of greater functional integration and the pursuit of lower power consumption, it is not unusual to find relatively large EEPROM arrays with associated operating/biasing circuitry residing on a single integrated circuit chip fabricated with CMOS technology.

As is well recognized, EEPROM cells are normally designed to retain the data entered for relatively long periods of time. However, write-erase cycles as well as time decreases the charge stored in the cells, which charge represents the programmed binary state/data. Consequently, it is very desirable to be able to evaluate the parameters which determine the state stored in each cell, not only from the perspective of determining whether the device is fully operative at the time of manufacture, but also to confirm the retention of a programmed state during subsequent usage.

In the context of an EEPROM configured from field effect type nonvolatile memory transistors, whether they be of floating gate or MNOS structure, the characterization of endurance and data retention typically includes the application of gate electrode bias voltages to detect the onset of conduction in the sense transistor of the memory cell. In the course of measuring the window between the binary "0" and binary "1" states, the threshold voltage applied to the memory transistor gate electrode often must be made negative with respect to the other voltages on the chip. To avoid inadvertent forward biasing of p-n junctions between field effect transistor source/drain regions, wells, and the substrate, it has become common practice to bias the substrate or wells with voltages in excess of those used to test the threshold window in the negative direction. The use of biasing is rather complicated when the chip upon which the nonvolatile memory array is to reside is fabricated using CMOS technology, in that now a multiplicity of p-n junctions variations exist, involving field effect transistor source/drain regions, wells, epitaxial layers and the substrate itself.

As another consideration, arrays of nonvolatile memory cells commonly have on-chip reference voltage generators to provide bias voltages which center the memory windows, the memory window being the voltage span bounded by the binary "0" and binary "1" threshold voltages. Since such reference voltage generators are subject to fabrication variabilities, it is important to be able to measure the on-chip reference voltage as an element of testing a nonvolatile memory array if the nominal storage capabilities of the memory cells are to be fully evaluated. In this regard, if the reference/bias voltage is not centered within the memory window, the data retention time of the memory cell can be reduced significantly.

From a practical perspective, if the memory array and peripheral circuitry are all resident on a single semiconductor chip, it is desirable to initiate and perform the various test functions described above with a minimum increase in the number of external input/output (I/O) pads.

One approach to accomplishing some of the objectives described above is set forth in U.S. Pat. No. 4,301,535. However, according to that teaching, the implementation is by way of n-channel MOS devices, in contrast to CMOS. The restrictions imposed are evident from the fact that the memory window for the "0" bit state is at plus two volts while that for the "1" bit state is plus eight volts. Because all the voltages are positive, undesired forward conduction through p-n junctions never arises.

The present control circuit provides in the context of a CMOS structure the ability to measure the on chip generated memory reference voltage and to measure the magnitude of the memory window for selected EEPROM cells with a minimum number of additional chip pads. A functional block diagram of the composite chip configuration appears in FIG. 1 of the drawings. There the CMOS nonvolatile memory devices are resident on a common chip, generally depicted as 1, which chip is shown to include a floating gate type EEPROM memory array 2 addressable by way of row decode 3 and column decode 4. Resident on the same integrated circuit chip is a reference voltage generator 6 providing as an output a reference voltage VREF of approximately plus one volt on output line 7, and a write voltage generator and control 8 selectively providing a voltage VW of either zero or approximately minus nine volts on output line 9. The latter two lines are connected as inputs to control circuit 11. Control circuit 11 also has connected thereto I/O lines IN1-IN3 from I/O pads 12. As embodied, the enablement of the memory reference voltage read mode and memory margining test mode, together with the sensing of responses thereto, is performed over I/O lines IN1-IN3. Control circuit 11 provides output voltages on lines 13 and 14, respectively identified as VMREF and MEMWELL.

The signal on line 13 is a reference voltage for centering the memory window during a normal read cycle of the data in the nonvolatile cells in memory array 2, and the signal on line 14 is a voltage for biasing the memory well during the reading, writing and memory margin testing of cells in memory array 2.

Figure 2:
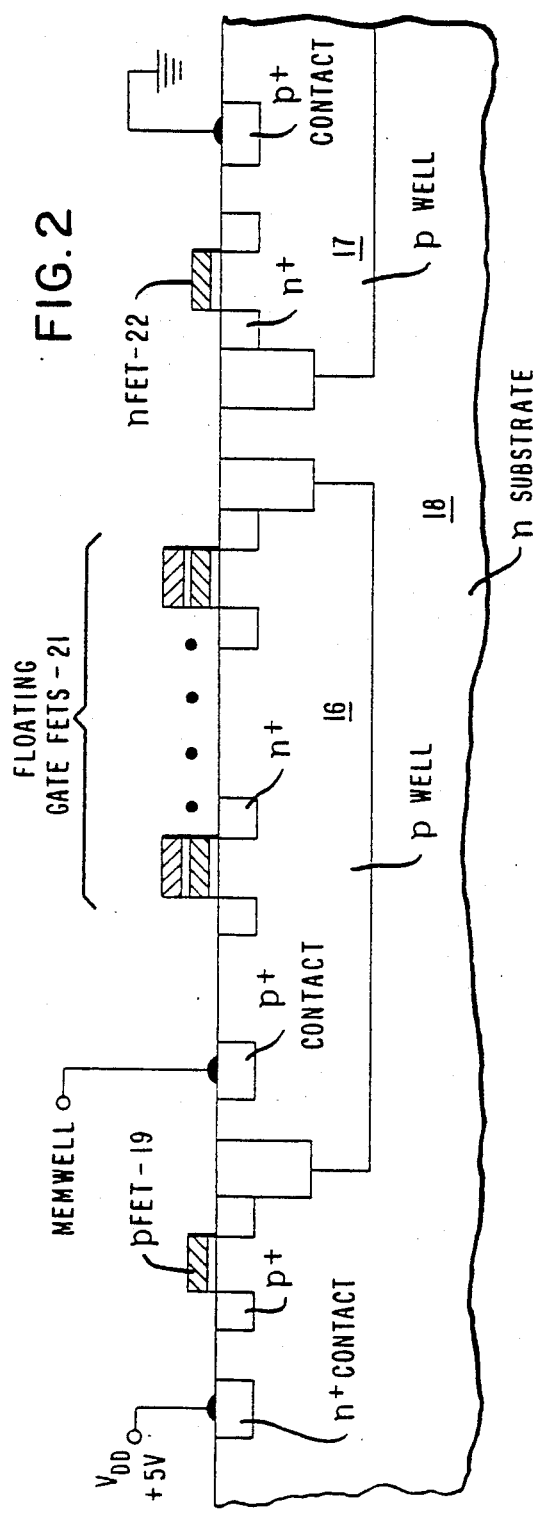
FIG. 2 is a schematic cross section of a semiconductor substrate embodying a memory array and active devices configured in CMOS.

A cross section of a CMOS type semiconductor chip 1 is schematically depicted in FIG. 2 of the drawings to illustrate the signal voltage polarity problems that are unique to CMOS. For purposes of such illustration, there is shown in FIG. 2 p-wells 16 and 17 formed in n-type substrate 18, including within such structure a p-channel FET 19 in substrate 18, an array of floating gate memory cell FETs 21 within p-well 16, and other logic FETs, such as n-channel FET 22, resident in p-well 17. Clearly, it is important that the p-n junctions between the source/drain regions of the various FETs and the substrate or well regions within which they reside do not become forward biased during the course of operating the devices.

Figure 4:
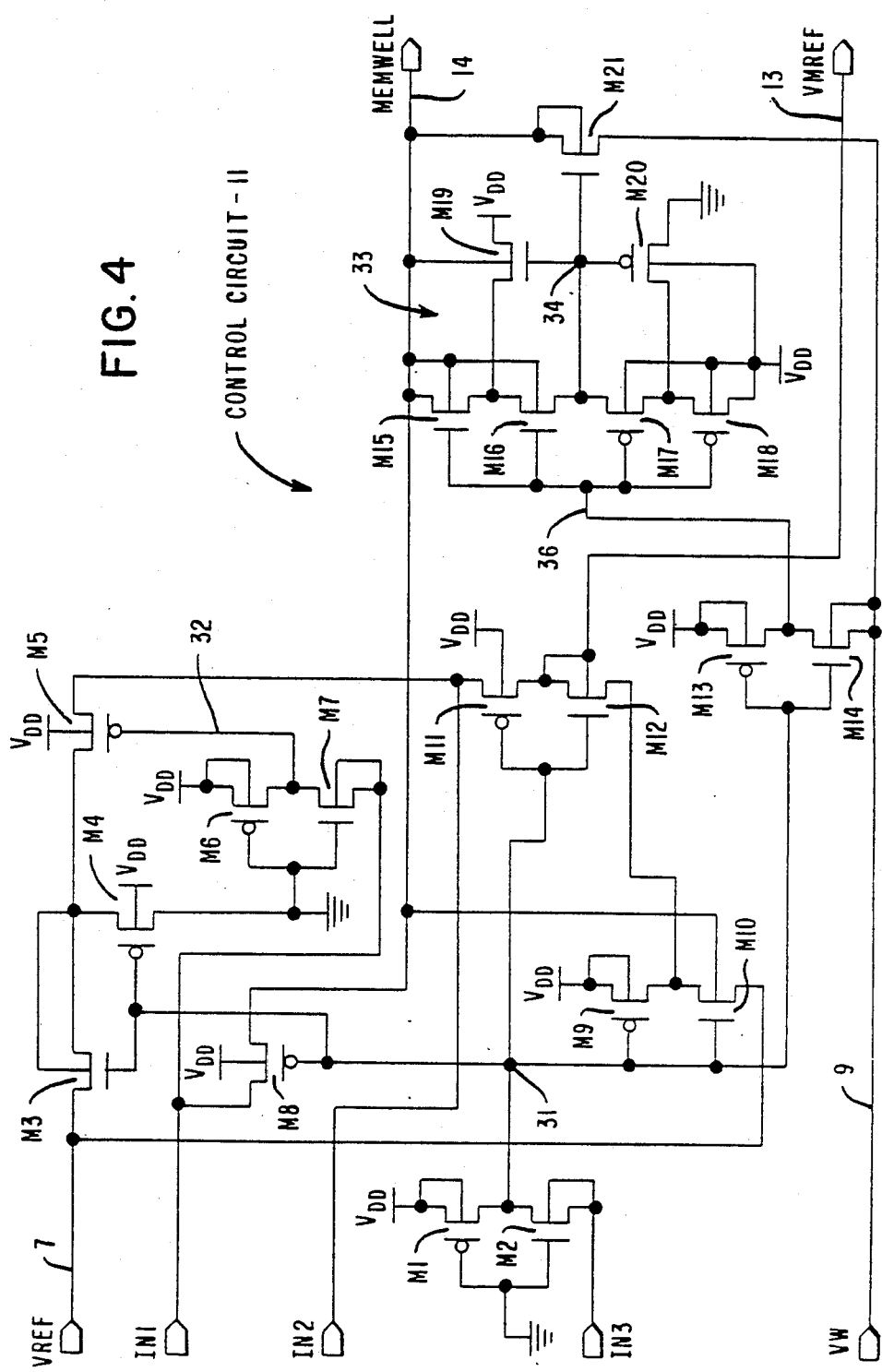
FIG. 4 is a schematic circuit of an embodying memory margining control circuit configured in CMOS.

Nevertheless, to optimize the retention and endurance characteristics of floating gate memory cell FETs 21, the window extends both positive and negative of ground. Therefore, both positive and negative voltages must be transmitted through the chip. The control and transmission of both positive and negative voltage signals on a CMOS chip is according to the present invention accomplished by control circuit 11, an embodiment of which is depicted in FIG. 4 of the drawings.

Any implementation of control circuit 11 in FIG. 1 using the CMOS technology requires careful consideration of all operational mode voltage magnitudes and polarities. First, the chip must operate in its normal modes of reading the selected/addressed memory cell or writing a "1" or a "0" state thereinto. In addition, control circuit 11 must now provide by way of I/O lines IN1-IN3 the ability to read the on-chip memory reference voltage in a second mode of operation. In the third mode, both positive and negative memory margining voltages must be capable of being selectively transferred onto the chip to measure the memory window of cell, undergoing evaluation.

TABLE A

|  | VREF | VW | IN1 | IN2 | IN3 | VMREF | MEMWELL |
|---|---|---|---|---|---|---|---|
| Normal Mode |  |  |  |  |  |  |  |
| Read | +1 V | 0 V | >0 V | >0 V | >0 V | +1 V | 0 V |
| Write "0" | +1 V | −9 V | >0 V | >0 V | >0 V | +1 V | −9 V |
| Write "1" | +1 V | −9 V | >0 V | >0 V | >0 V | +1 V | −9 V |
| Reference Read | +1 V | 0 V | −5 V | VREF | >0 V | +1 V | 0 V |
| Mode |  |  |  |  |  |  |  |
| Margining Mode | +1 V | 0 V | 0/−2.5 V | TESTV | −5 V | TESTV | 0/−2.5 V |

Figure 3:
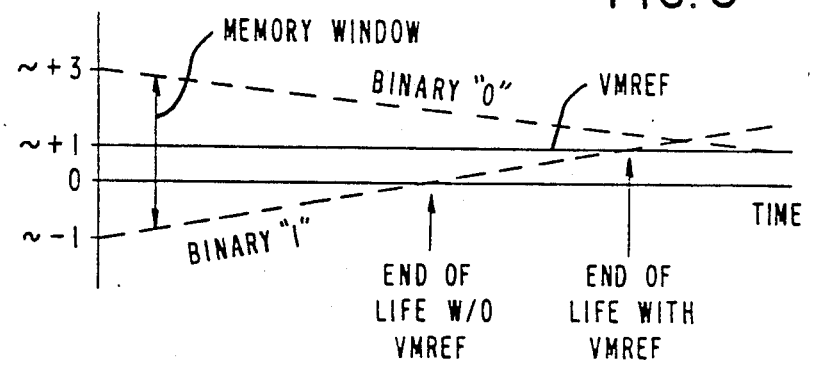
FIG. 3 is a plot of the memory margining voltage for a typical nonvolatile memory cell plotted with respect to time.

Table A sets forth the operating modes and corresponding node voltages for the circuit in FIG. 4. To more fully appreciate the reasons for the voltages set forth in Table A and the corresponding need for the unique features in control circuit 11, consider the nonvolatile memory retention characteristics represented by the plot in FIG. 3 of the drawings. The plot set forth in FIG. 3 depicts the memory window for a typical cell from EEPROM array 2 (FIG. 1). The memory window is bounded by the threshold voltages of the cell active device, typically a sense FET, corresponding to a nonvolatilely written "1" or "0" state projected with time. For example, if a cell were written to a binary "0" state, and the threshold voltage of the nonvolatile device measured immediately thereafter, one would obtain a value of approximately plus 3 volts. In contrast, if the same device were written and measured for a binary "1" state, the outcome would be a threshold voltage of approximately minus 1 volts. Consequently, it can be said that the memory device immediately following writing has a window of 4 volts separating the two binary states. The "0" and "1" state retention characteristics of the memory cell, represented by the degradation in the memory window with time are important for users of EEPROMs in that they provide at the time, of manufacture an indication of the cell's future performance, and at a later time, to a user thereof, provides an indicator as to whether the nonvolatile data should be refreshed.

It is also common in the manufacture of nonvolatile memory cells to utilize memory cell designs which form devices having memory windows asymmetrically distributed around the zero volt level. To avoid unduly shrinking the memory window and establishing a premature end of life condition it becomes necessary to use a bias voltage, herein VMREF, during the cell read operation to shift and thereby center the memory window. Consequently, both the memory window and bias voltage are important measurements in determining a reasonable data retention period.

A consideration of the cell retention characteristics plotted in FIG. 3 should also bring to light the fact that the threshold voltages which define the boundaries of the memory window not only exhibit negative excursions, but are variables which differ from cell to cell. For that reason, the determination of the memory window for any selected cell requires that testing voltages with negative excursions be applied to detect the threshold voltage of the active device within the cell is encountered. In summary then, the representation in FIG. 3 illustrates that if one is to fully evaluate the retention characteristics of a nonvolatile memory cell, the chip upon which the memory array resides must be capable of being accessed to measure the internally generated reference voltage, must be capable of transmitting analog levels of margining voltage to detect the threshold levels, and must be capable of receiving margining voltages which are negative in relation to ground. The importance of retaining a CMOS structure and minimizing the I/O pad count should not be overlooked.

Attention is now directed to FIG. 4 of the drawings, where a preferred embodiment of control circuit 11 is depicted as would be configured using field effect transistors formed in a unified CMOS configured substrate. Note the correspondence of connections VW, VREF, VMREF, MEMWELL and IN1-IN3 as first depicted in FIG. 1. Recall from the earlier discussion that input lines IN1-IN3 are connection by which electronics signals generated off the substrate are connected via I/O pads to substrate nodes and conductive lines. As will be understood upon considering the embodying control circuit 11, the inputs IN1-IN3 have been configured to optimize their usage and thereby minimize the numerical number required. To understand the functions of the various operating modes and the effects on line voltages within control circuit 11, interchangeably referred to as substitute nodes hereinafter, attention is redirected to Table A.

Table A defines the three basic modes of operation. First, there is a normal mode, including a nonvolatile memory read function, a nonvolatile memory write "1" function and a nonvolatile memory write "0" function. The second of the modes involves a reading of the reference voltage generated on the chip, and is generally referred to as the memory reference read mode. The last of the modes set forth in Table A is the memory margining test mode, a mode used to determine the memory window of an addressed cell. In the ensuing description, it may be of assistance to consider the voltages set forth in Table A while analyzing the operation of the devices in control circuit 11 to more fully understand the relationship between the various input and output signals.

Normal Mode

The normal mode of operation involves either a reading of the data that is stored in a nonvolatile memory cell or a writing of a "0" or a "1" data state into the addressed memory cell. The reading mode of control circuit 11 is initiated by applying a voltage of zero or greater to pad input lines IN1-IN3. Thereupon, the reference voltage generated on the substrate, and available at node VREF, is coupled to output node VMREF of control circuit 11. The voltage connected to node VW, generated and controlled by write voltage generator 8 (FIG. 1) is then set to zero volts. Under those conditions, FETs M1 and M2 provide on node 31 a voltage of approximately VDD, in this case being the nominal power supply voltage of plus five volts. Node 31 remains at VDD so long as the voltage on node IN3 is not more negative than the threshold of n-channel M2. As presently configured, the n-channel FETs in control circuit 11 have a threshold of approximately +0.8 volts while the p-channel FETs have a threshold voltage of approximately −0.8 volts. The output of the inverter formed by FETs M6 and M7 as measured on node 32 is similarly driven to approximately VDD during the read segment of the normal operating mode. With nodes 31 and 32 at approximately VDD, p-channel FET M8 is disabled, isolating input IN1 from the node MEMWELL, while n-channel FET M3 is conducting to pass the reference voltage on node VREF to the drain of p-channel FET M5. With node 32 at approximately VDD FET M5 remains disabled, isolating the voltage on node VREF from node IN2.

With the voltage on node 31 at approximately VDD, FETs M10, M12 and M14 of the inverter pairs M9/M10, M11/M12 and M13/M14 are in a conducting state. In that situation, the bias voltage on VREF passes through transistors M10 and M12 to node VMREF. Node VMREF biases the gates electrodes of the memory cell active FET devices to center the relative memory window, in the manner described earlier with reference to FIG. 3. With p-channel FET M11 disabled, the voltage on node VREF is not passed to node IN2. Recall that during the read segment of the normal mode node VW is at zero volts.

The other segment of the normal mode of operation arises when the cells in the nonvolatile memory array are being written to their binary "0" or "1" states. During writing, it is desired that the minus nine volts which appears on node VW be transferred to the memory well node MEMWELL. According to the embodiment, this is accomplished by providing a minus nine volts to node VW, which by virtue of the threshold of n-channel transistor M14 is passed to node 36, the input of the Schmitt trigger 33 composed of FETs M15-M20. The output of the Schmitt trigger 33 on node 34 controls FET M21.

When control circuit 11 is being operated in the read segment of the normal mode, VW is at zero volts. This zero volt level is coupled through FET M14 to node 36,. With a zero volt level on node 36, the output of Schmitt trigger 33 on node 34 is high, and as such enables conduction through FET M21 so that node MEMWELL is at the same zero potential as node VW. When node VW is switched to minus nine volts, during the write segment of the normal mode, the input to Schmitt trigger 33 on node 36 will also be minus nine volts, ensuring the continuity of the high output voltage on output node 34 and the continued conduction of FET M21. Thereby, the voltage on node VW, minus nine volts, is again transmitted through to node MEMWELL.

Memory Reference Read Mode

The memory reference read mode, as noted earlier, provides a means for measuring from a location off the chip the on-chip generated bias voltage on node VREF. To accomplish this, node IN1 is now brought to minus five volts and IN3 is biased at or above zero volts. IN2 then becomes an output, providing via FETs M3 and M5 the voltage available on node VREF. As embodied, the VREF bias voltage is in the range of plus one volt.

Operationally, a negative voltage on I/O pad IN1 initiates conduction through FET M7 to lower the voltage on node 32 to nearly minus five volts. FET M3 conducts by virtue of the high voltage state of node 31 to create a path to now-enabled p-channel FET M5 and on to node IN2.

Memory Margining Mode

The last mode enabled by control circuit 11 is the memory margining test mode, during which the memory window defined by the "0" and "1" state threshold voltages of the addressable nonvolatile memory cells are measured by detecting cell responses in relation to memory margin input voltage variations. The memory margining mode is initiated by providing through pad IN3 an enable signal of approximately minus five volts, providing a memory well bias voltage to node MEMWELL on node IN1, and providing the actual memory margining test voltages to node IN2. It should be recognized that the MEMWELL node voltage, connected to the p-wells of the substrate, must be more negative than the test voltage applied to node IN2 if undesired forward biasing of p-n junctions is to be avoided. The selection for I/O node IN1 therefore presupposes that the voltage applied to node IN2 will in all cases be more positive.

Upon commencing the memory margin test mode, nodes IN1 and IN2 are initially held at approximately zero volts to prevent any transient induced disturbances of the data in the nonvolatile memory cells or inadvertent forward biasing of transient charge created by parasitic diodes. These and other timing constraints are visibly evident from the waveforms plotted in FIG. 5.

Figure 5:
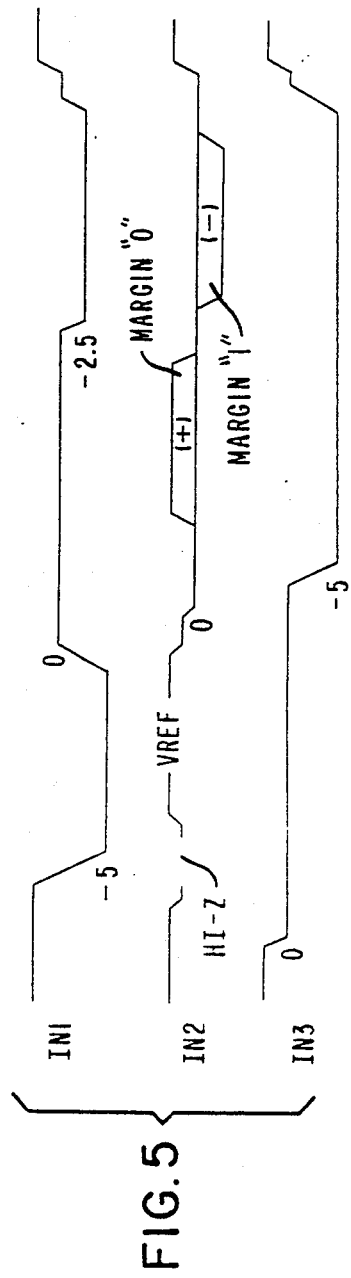
FIG. 5 illustrates the voltage-time characteristics of the drive signals used to operate the CMOS memory margining circuit as embodied herein.

The signals to the left of FIG. 5 illustrate suitable voltage states for input/output nodes IN1-IN3 during the memory reference read mode, and further illustrate the transition into the memory margining mode. The illustrated signals show that input node IN1 is at zero volts during the positive memory margining interval and is biased at minus 2.5 volts during the memory margining on the negative side of the window, of course recognizing that minus 2.5 remains more negative than the lowest negatively directed memory margining test voltage. Note, as to the latter, that the representative window in FIG. 3 shows a maximum negative excursion of approximately one volt for the binary "1" data state.

Again with reference to FIG. 4 and Table A, memory margining is initiated by applying minus five volts to input/output node IN3, which is then passed in succession through FET M2 to node 31, turning on p-channel FET M8 and switching the output of inverter pair FETs M13/M14 on node 36 to disconnect node VW and to connect VDD. With node 36 at VDD, Schmitt trigger 33 switches to a low output voltage on node 34 and thereby disables FET M21.

With FET M21 disabled and FET M8 enabled, the minus 2.5 volts on I/O node IN1 is coupled to node MEMWELL. The negative voltage on node IN1 is also passed through inverter pair M6/M7 to provide on node 32 a similarly negative potential, which negative potential enables FET M5. However, in series with FET M5 is FET M3, which is disabled by the potential on node 31. Thereby, the test voltage on I/O node IN2 is isolated from node VREF.

When I/O node IN1 is at zero volts, for instance according to the waveform in FIG. 5, and input node IN3 is at minus five volts, FETs M3 and M5 are both disabled while p-channel FET M4 is enabled. This avoids problems associated with the floating of the drain and source electrodes of FETs M3 and M5. However, FET M4 should be of sufficiently high impedance to avoid an excess current draw on input node IN2 when margining the "1" binary level with input node IN1 at minus 2.5 volts and FET M5 conducting the margining test voltage applied to node IN2.

The margining test voltage on node IN2 is connected to bias the memory gates of the nonvolatile devices in the cells of the array through node VMREF using p-channel FET M11. This occurs because p-channel FETs M9 and M11 are conducting while n-channel FETs M10 and M12 of the corresponding inverters are nonconducting when the inverters are driven by the minus five volts coupled to node 31 from I/O node IN3. This combination isolates node VREF while providing a direct path from node IN2 to node VMREF through FET M11. The source electrode of FET M12 is pulled to the positive power supply voltage VDD by the conduction of p-channel FET M9 to prevent any parasitic diode conduction when a positive margin voltage is applied via I/O node IN2.

Schmitt trigger 33 is used to control gating FET 21 so that switching of the voltages connected to node MEMWELL are performed with rapid and singular transitions during the entry and departure of the memory margining test mode.

It should be understood that though the invention has been described by way of a specific embodiment, the underlying concepts are not so circumscribed. Accordingly, the claims should be interpreted in keeping with the functional attributes of the invention as claim, and not limited particular arrangement of active devices structurally depicted in FIG. 4 and functionally described with reference to Table A and FIG. 5.

What is claimed is:

1. A control circuit for testing the memory margin and the read reference potential of nonvolatile memory cells resident on a substrate having complimentary MOS devices, comprising:

wells of first impurity type having formed therein field effect devices of second impurity type, the substrate itself being of second impurity type;
    means for generating a reference potential on the substrate;

means for selectively connecting the reference potential to gate electrodes of selected memory cells in time correspondence with a connection of selected wells for the selected memory cells to a first substrate node providing a first potential;

means for enabling the measurement of the reference potential at a second substrate node responsive to a control signal connected through a third substrate node; and means responsive to a memory margining test mode enabling signal on a fourth substrate node for selectively enabling the measurement of memory cell threshold potentials of a first polarity type, corresponding to a first binary state stored in a cell, by connecting a first well bias potential through the third substrate node to selected wells, and by connecting a margin testing potential through the second substrate node to the gate electrodes of selected memory cells, and for selectively enabling the measurement of memory cell threshold potentials of a second polarity type, corresponding to a second binary state stored in a cell, by connecting a second well bias potential through the third substrate node to selected wells, and by connecting a margin testing potential through the second substrate node to the gate electrodes of selected memory cells.

2. The apparatus recited in claim 1, wherein the margin testing potential varies both positive and negative of substrate ground.

3. The apparatus recited in claim 2, wherein multiple memory cells are situated in a common well, which well is electrically connected to the first substrate node through a first field effect switching device.

4. The apparatus recited in claim 3, wherein the first field effect switching device is responsive to the potential of the memory margining test mode enabling signal on the fourth substrate node.

5. The apparatus recited in claim 4, wherein the first field effect switching device is a transistor connected in series between the first substrate node and the wells, which transistor is driven by a Schmitt trigger circuit responsive to the memory margining test mode enabling signal.

6. Of the apparatus recited in claim 3, wherein the means for enabling the measurement of the reference potential includes a second field effect switching device situated between the reference potential and the gate electrodes of the memory cells, and is responsive to an enabling signal on the fourth substrate node.

7. The apparatus recited in claim 6, wherein the third substrate node is connected to a well through a third field effect switching device, the device being responsive to an enabling signal on the third substrate node.

8. The apparatus recited in claim 7, wherein the first well bias potential is substantially substrate ground and the second well bias potential is negative for p-type impurity wells and positive for n-type impurity wells.

9. The apparatus recited in claim 8, wherein the magnitude of the second well bias potential is relatively equal to or greater than the margin testing potential.

* * * * *